(12) United States Patent
Shiraishi et al.

(10) Patent No.: US 7,504,670 B2
(45) Date of Patent: Mar. 17, 2009

(54) SEALING STRUCTURE FOR MOUNTING A SEMICONDUCTOR DEVICE TO A SUBSTRATE

(75) Inventors: Satoshi Shiraishi, Nagano (JP); Yoichi Kazama, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/422,777

(22) Filed: Jun. 7, 2006

(65) Prior Publication Data

US 2006/0278946 A1 Dec. 14, 2006

(30) Foreign Application Priority Data

Jun. 9, 2005 (JP) ............................. 2005-169893

(51) Int. Cl.
| | |
|---|---|
| H01L 29/22 | (2006.01) |
| H01L 33/00 | (2006.01) |
| H01L 23/02 | (2006.01) |
| H01L 23/20 | (2006.01) |
| H01L 23/16 | (2006.01) |
| H01L 23/58 | (2006.01) |
| H01L 23/06 | (2006.01) |
| H01L 23/22 | (2006.01) |
| H01L 23/48 | (2006.01) |
| H01L 23/52 | (2006.01) |
| H01L 23/10 | (2006.01) |
| H01L 23/12 | (2006.01) |

(52) U.S. Cl. .................. 257/99; 257/678; 257/679; 257/680; 257/681; 257/682; 257/683; 257/684; 257/687; 257/688; 257/689; 257/690; 257/691; 257/692; 257/693; 257/694; 257/695; 257/696; 257/697; 257/698; 257/699; 257/700; 257/701; 257/702; 257/703; 257/704; 257/705; 257/706; 257/707; 257/708; 257/709; 257/710; 257/711; 257/712; 257/713; 257/714; 257/715; 257/716; 257/717; 257/718; 257/719; 257/720; 257/721; 257/722; 257/723; 257/724; 257/725; 257/726; 257/727; 257/728; 257/729; 257/730; 257/731; 257/732; 257/733; 257/783; 257/787; 257/788; 257/789; 257/790; 257/791; 257/792; 257/793; 257/794; 257/795

(58) Field of Classification Search ......... 257/678–684, 257/687–733, 783, 787–798
See application file for complete search history.

(56) References Cited

U.S. PATENT DOCUMENTS 5,311,402 A * 5/1994 Kobayashi et al. .......... 361/760

(Continued)

FOREIGN PATENT DOCUMENTS

JP 03105950 A * 5/1991

(Continued)

*Primary Examiner*—Ida M Soward
(74) *Attorney, Agent, or Firm*—Rankin, Hill & Clark LLP

(57) ABSTRACT

A semiconductor device includes: a substrate; a semiconductor element mounted on the substrate; a sealing structure for sealing the semiconductor element, the sealing structure being mounted on the substrate; and an adhesive for bonding the sealing structure and the substrate, wherein the sealing structure has a groove for storing the adhesive.

16 Claims, 4 Drawing Sheets

U.S. PATENT DOCUMENTS

| | | | |
|---|---|---|---|
| 5,461,256 A * | 10/1995 | Yamada et al. | 257/679 |
| 5,956,576 A * | 9/1999 | Toy et al. | 438/125 |
| 5,998,862 A * | 12/1999 | Yamanaka | 257/704 |
| 6,218,730 B1 * | 4/2001 | Toy et al. | 257/704 |
| 6,410,981 B2 * | 6/2002 | Tao | 257/704 |
| 6,486,548 B1 * | 11/2002 | Nakatsu et al. | 257/690 |
| 6,747,346 B2 * | 6/2004 | Saito et al. | 257/684 |
| 6,856,015 B1 * | 2/2005 | Huang et al. | 257/706 |
| 6,933,537 B2 * | 8/2005 | Yee et al. | 257/99 |
| 6,982,470 B2 * | 1/2006 | Omori | 257/434 |
| 7,203,072 B2 * | 4/2007 | Chen et al. | 361/760 |
| 2004/0016871 A1 * | 1/2004 | Mogamiya et al. | 250/208.1 |
| 2004/0174682 A1 * | 9/2004 | Lin et al. | 361/705 |
| 2005/0161802 A1 * | 7/2005 | Hosoya | 257/696 |

FOREIGN PATENT DOCUMENTS

| | | | |
|---|---|---|---|
| JP | 04102363 A * | 4/1992 | |
| JP | 2005-039152 | 2/2005 | |

\* cited by examiner

100

SEALING STRUCTURE FOR MOUNTING A SEMICONDUCTOR DEVICE TO A SUBSTRATE

This application claims foreign priority based on Japanese Patent application No. 2005-169893, filed Jun. 9, 2005, the content of which is incorporated herein by reference in its entirety.

BACKGROUND OF THE INVENTION

1. Field of the Invention

This invention relates to a semiconductor device with a semiconductor element formed on a substrate, and a method for manufacturing the semiconductor device. More specifically, this invention relates to a semiconductor device having a structure in which the semiconductor element is sealed by a sealing structure, and a method for manufacturing the semiconductor device.

2. Description of the Related Art

In recent years, because of rapid progress and development of information communication technology, the improvement of data communication speed and extension of data communication quantity have been realized. As a result, there are prevailing mobile electronic devices such as a cellular phone and notebook personal computer incorporating a semiconductor device (image pick-up device) such as a CCD (charge-coupled device) image sensor or CMOS image sensor. These mobile devices can transmit/receive image data imaged by the above image pick-up device as well as text data.

An example of a structure of the semiconductor device (image pick-up device) used in these mobile devices is shown in FIG. 1.

Referring to FIG. 1, an illustrated semiconductor device (image pick-up device) 100 has a schematic structure in which a semiconductor element 102 such as a photoelectric conversion element including the CCD image sensor, CMOS image sensor or the like is formed on a substrate 101 and a sealing structure 201 for sealing the semiconductor element 102 is mounted on the substrate 101.

The sealing structure 201 includes, for example, a structure main body 202 having a structure in which cylinder-like-shaped members with different diameters are connected to each other, and a condensing section 203, such as a lens, being mounted so as to cover an aperture of the structure main body 202.

An opening of the structure main body 202 opposite to the aperture on the side where the condensing section 203 is mounted is formed so as to abut on the substrate 101. The structure main body 202 and the substrate 101 are bonded to each other by an adhesive 104 to seal a space 103 including the semiconductor element 102 on the substrate 101. Thus, the space 103 is separated from outside air so as to prevent incident light on the semiconductor element from being blocked owing to dust applied on the semiconductor element 102, for example. (For example, refer to JP-A-2005-39152.)

In the semiconductor device 100, however, a problem arises that the adhesive 104 for bonding and sealing the sealing structure 201 to the substrate 101 overflows on the outer wall of the structure main body 202 and extends over the outer wall.

Owing to this, the adhesive 104 contaminates the outer wall of the structure main body 202. In addition, for example, in the case of the structure in which the semiconductor device is mounted at high density and hence the components, elements, etc., are formed or arranged in the vicinity of the outer wall, the overflow of the adhesive problematically interferes with the components, etc.

The structure main body 202 serves as an electromagnetic shield for the semiconductor element 102 and so is preferably connected to ground. For example, if the structure main body 202 is connected to ground through its outer wall, application of the adhesive made of insulating resin on the outer wall deteriorates reliability of electric connection in a grounding circuit. Thus, the grounding becomes insufficient and the electromagnetic shielding effect cannot be obtained, thus noise influence may be generated on the semiconductor element.

SUMMARY OF THE INVENTION

The present invention has been made in view of the above circumstances, and provides a new and useful semiconductor device and a method for manufacturing the same, which can solve the above problem.

The present invention provides a semiconductor device and a method for manufacturing the same, the semiconductor device having a structure in which a semiconductor element is sealed on a substrate, capable of providing good reliability of the structure for sealing the semiconductor element and high reliability of electric connection.

In some implementations, a semiconductor device of the invention comprises:

a substrate;

a semiconductor element mounted on the substrate;

a sealing structure for sealing the semiconductor element, the sealing structure being mounted on the substrate; and an adhesive for bonding the sealing structure and the substrate, wherein the sealing structure has a groove for storing the adhesive.

According to the above semiconductor device, good reliability of the structure for sealing the semiconductor element and high reliability of electric connection are provided.

In the semiconductor device of the invention, the groove is provided on an outer surface of the sealing structure on a side abutting the substrate.

In the semiconductor device of the invention, the groove is provided in an entire circumference of the sealing structure. Accordingly, it is easy to manufacture the main body having the groove by molding.

In the semiconductor device of the invention, the semiconductor element is a photoelectric conversion element. Accordingly, it is possible to provide a semiconductor device capable of providing good reliability of the structure for sealing the semiconductor element and high reliability of electric connection.

In the semiconductor device of the invention, the sealing structure includes:

a main body on which the groove is formed; and a condensing section for condensing an incident light on the semiconductor element, the condensing section being attached to the main body. Accordingly, it is possible to provide a semiconductor device having an image pick-up function with high reliability of electric connection.

The semiconductor device of the invention further comprises:

an adjusting section for adjusting a distance between the condensing section and the semiconductor element. Accordingly, it is possible to adjust a focal point for image pick-up of the photoelectric conversion element.

In the semiconductor device of the invention, the main body includes a conductive material. Accordingly, the main body serves as an electromagnetic shield for the semiconductor element.

In the semiconductor device of the invention, the main body is made of a mixed material including a resin material and the conductive material. Accordingly, the main body serves as the conductive material and can be easily molded into a complicate and fine structure.

In the semiconductor device of the invention, a conductive coating is formed on a surface of the main body. Accordingly, the electric resistance of the main body can be reduced.

In some implementations, a method of the invention for manufacturing a semiconductor device comprises:

mounting a semiconductor element on a substrate; and bonding a sealing structure for sealing the semiconductor element onto the substrate by an adhesive, wherein the sealing structure has a groove for storing the adhesive.

In accordance with this manufacturing method, it is possible to provide a semiconductor device having a structure in which a semiconductor element is sealed on a substrate, capable of providing good reliability of the structure for sealing the semiconductor element and high reliability of electric connection.

In the method of the invention for manufacturing the semiconductor device, the groove is provided on an outer surface of the sealing structure on a side abutting the substrate.

In the method of the invention for manufacturing the semiconductor device, the groove is provided in an entire circumference of the sealing structure.

In the method for manufacturing the semiconductor device of the invention, the semiconductor element is a photoelectric conversion element. Accordingly, it is possible to provide a semiconductor device capable of providing good reliability of the structure for sealing the semiconductor element and high reliability of electric connection.

In the method of the invention for manufacturing the semiconductor device, the sealing structure includes:

a main body on which the groove is formed; and a condensing section for condensing an incident light on the semiconductor element, the condensing section being attached to the main body. Accordingly, it is possible to provide a semiconductor device having an image pick-up function with high reliability of electric connection.

In accordance with this invention, there is provided a semiconductor device having a structure in which a semiconductor element is sealed on a substrate, capable of providing good reliability of the structure for sealing the semiconductor element and high reliability of electric connection.

DESCRIPTION OF THE PRFERRED EMBODIMENTS

Figure 1:
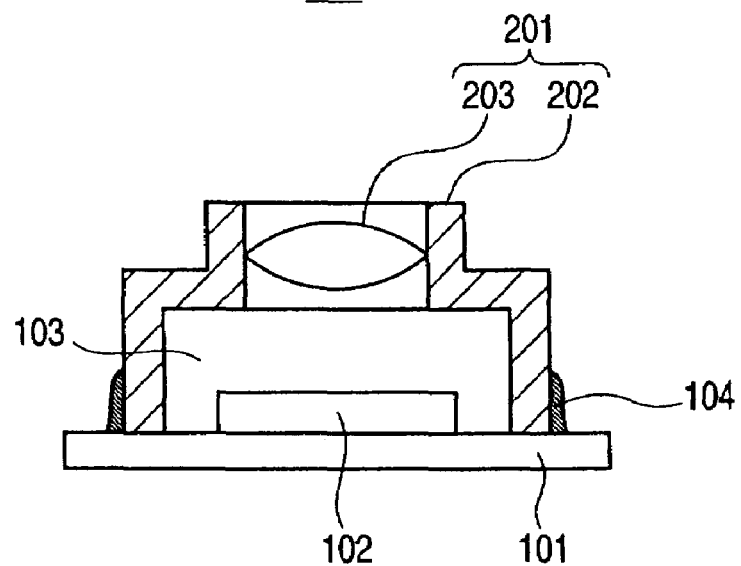
FIG. 1 is a view showing a structure of a related semiconductor device.

Now referring to the drawings, an explanation will be given of various embodiments of this invention.

First Embodiment

Figure 2:
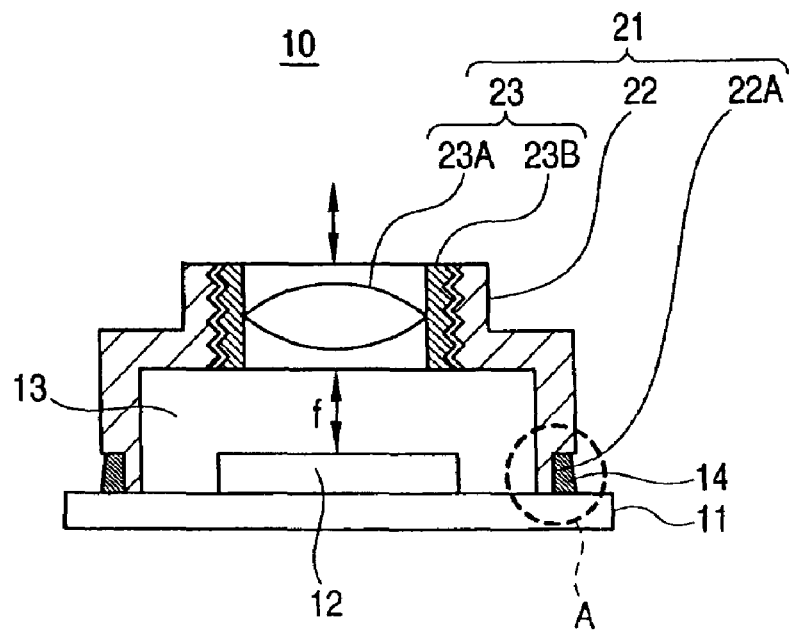
FIG. 2 is a view showing a structure of a semiconductor device according to a first embodiment.

FIG. 2 is a sectional view schematically showing a semiconductor device 10 according to a first embodiment of this invention. Referring to FIG. 2, the semiconductor device 10 has a schematic structure in which a semiconductor element 12 such as a photoelectric conversion element including the CCD image sensor, CMOS image sensor or the like is formed on a substrate 11, and a sealing structure 21 sealing the semiconductor element 12 is mounted on the substrate 11.

The sealing structure 21 includes, for example, a cap-like structure main body 22 having a structure in which cylinder-like-shaped members with different diameters are connected to each other, and a condensing section 23 mounted so as to cover an aperture of the structure main body 22.

The condensing section 23 has a structure including a lens 23A and an attachment 23B having a screw. The inner wall of the structure main body 22 abutting on the attachment 23B has a screw formed so as to correspond to the screw of the attachment 23B. Thus, a structure is given which can adjust a distance of between the condensing section 23 and the semiconductor element 12 by rotating the condensing section 23. This permits adjustment of a focal point for image pickup in the semiconductor element 12 serving as the photoelectric conversion element.

An opening of the structure main body 22 opposite to the aperture on the side where the condensing section 23 is mounted is formed so as to abut on the substrate 11. The structure main body 22 and the substrate 11 are bonded to each other by an adhesive 14 to seal a space 13 including the semiconductor element 12 on the substrate 11. Thus, the space 13 is separated from outside air so as to prevent incident light on the semiconductor element from being blocked owing to dust applied on the semiconductor element 12, for example.

Figure 3:
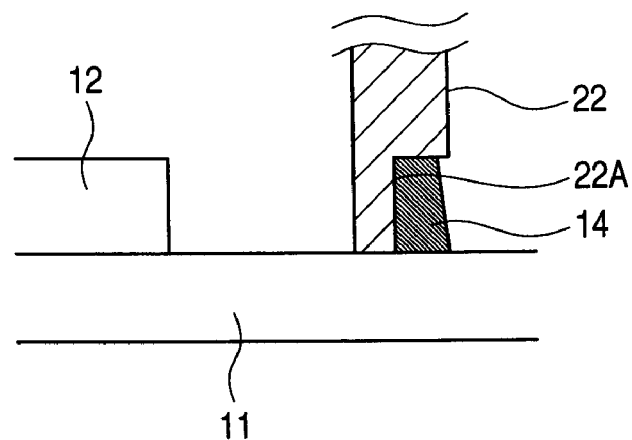
FIG. 3 is a partially enlarged view of the semiconductor device shown in FIG. 2.

FIG. 3 is an enlarged view of part A in FIG. 2. In FIG. 3, like reference symbols refer to like parts in the above description. As seen from FIG. 3, in the semiconductor device 10 according to the invention, the structure main body 22 has a groove 22A for storing the adhesive 14. The groove 22A is formed in a concave shape on the outer periphery of the structure main body 22 on the side abutting on the substrate 11.

The groove 22A may be provided anywhere of the structure main body 22 on the side abutting on the substrate 11, for example, the inner periphery of the structure main body 22. Furthermore, the groove 22A may be provided at least in vicinity of a contact section between a grounding section 31A of a holding container 31 (which will be described later) and the structure main body 22. However, when the groove 22A is provided in an entire circumference of the structure main body 22, it is easy to manufacture the structure main body 22 having the groove 22A by molding.

The adhesive 14, therefore, does not overflow on the outer wall of the structure main body 22 so that the outer wall will not be covered with the adhesive. In the semiconductor device according to this embodiment, it is possible to prevent the outer wall of the structure main body 22 from being contaminated, and also possible to mount the semiconductor device at high density. For example, it is possible to prevent the overflowed adhesive from interfering with other electronic components so that the semiconductor device 10 can be mounted on a mother board at high density.

The structure main body 22 is formed by injection molding of e.g. polycarbonate resin doped with a conductive material (particles of Ni and carbon). The structure main body 22, therefore, has a function of electromagnetic shielding for the semiconductor element 12 to suppress noise influence on the semiconductor element 12. Further, since the structure main body 22 is formed by injection molding, it can deal with fine machining for e.g. the screw.

In order to improve the above electromagnetic shielding, the structure main body 22 is preferably connected to ground. In the semiconductor device 10 according to this embodiment, the overflow of the adhesive on the outer wall of the structure main body 22 is suppressed so that reliability of the electric connection of the grounding circuit is improved when the structure main body 22 is connected to ground using this outer wall. This gives sufficient shielding effect, and excludes the noise influence on the semiconductor element, thereby providing a semiconductor device with high reliability.

Further, in order to further reduce the resistance of the surface of the structure main body 22, it is more preferable to form a conductive thin coating (e.g. Al coating) made of a metallic material on the structure main body surface by e.g. sputtering.

Figure 4:
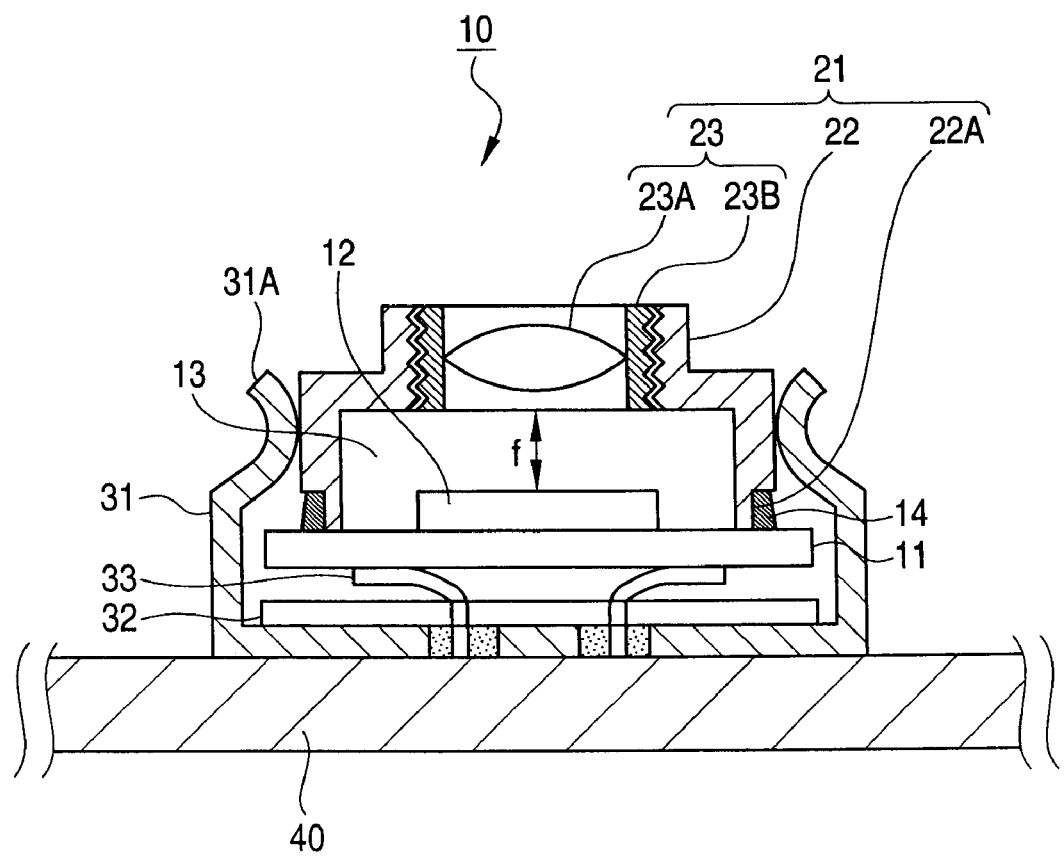
FIG. 4 is a view showing an example of mounting the semiconductor device shown in FIG. 2.

For example, FIG. 4 is a view schematically showing an example of the structure in which the semiconductor device 10 is mounted. In FIG. 4, same reference numerals are applied to parts which are described above.

Referring to FIG. 4, the semiconductor device 10 is installed on a mother board 40 through e.g. a metallic holding container (socket) 31 so that the semiconductor device 10 is held in the holding container 31. The holding container 31 has a grounding section 31A which holds the semiconductor device 10 by sandwiching with elastic force of the metal. The grounding section 31A holds the structure main body 22 by the elastic force and is kept in contact with the structure main body 22 so as to be connected to ground.

In this case, in the structure main body 22 according to this embodiment, since the overflow of the adhesive 14 is suppressed, the reliability of the connection of the grounding circuit is improved, thereby improving the electromagnetic shielding effect of the structure main body 22. Further, the groove 22A is preferably formed at the position nearer to the side of the substrate 11 than a contact section between the grounding section 31A and the structure main body 22 so that the groove 22A does not electrically interfere with the electric connection between the grounding section 31A and the structure main body 22. As described above, the groove 22A may be provided at least in vicinity of the contact section between the grounding section 31A of the holding container 31 and the structure main body 22.

On the bottom of the holding container 31, a substrate 32 with e.g. contact pins 33 is placed so that the semiconductor element 12 and the circuit on the mother board 40 can be connected.

Next, referring to FIGS. 5A to 5C, an explanation of an example of a method for manufacturing the semiconductor device 10 will be given in order. In these figures, same reference numerals are applied to parts which are described above.

Figure 5A:
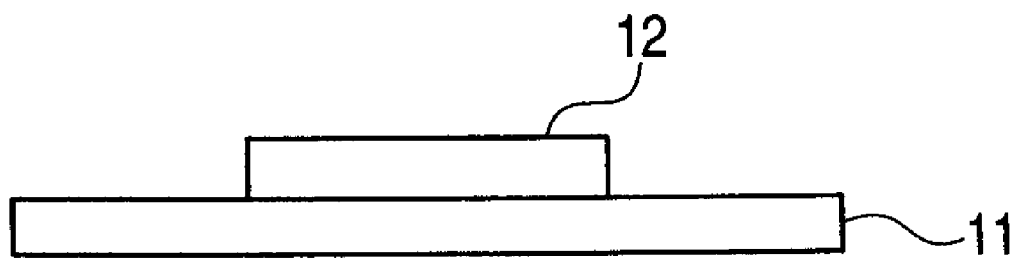
FIG. 5A is a view (first step) showing a method for manufacturing the semiconductor device shown in FIG. 2.

First, in a step shown in FIG. 5A, the semiconductor element 12 is mounted on the substrate 11. For example, the semiconductor element 12 is electrically connected to wirings on the substrate 11 by bonding wires (not shown).

Figure 5B:
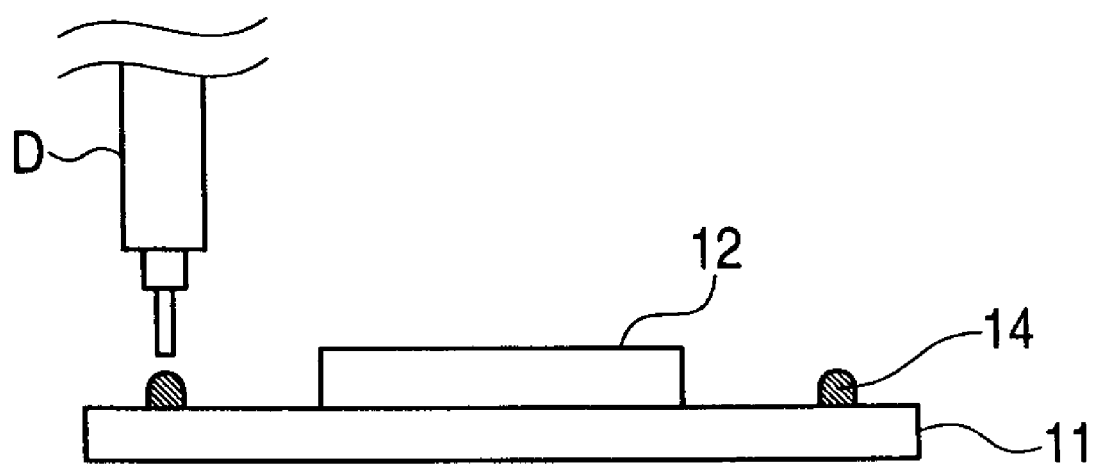
FIG. 5B is a view (second step) showing the method for manufacturing the semiconductor device shown in FIG. 2.

Next, in a step shown in FIG. 5B, the adhesive 14 for bonding is located at a predetermined position on the substrate 11 using a dispenser D. The locating position of the adhesive 14 is set so as to correspond to the shape of the lower end of the structure main body 22. The adhesive 14 for bonding is preferably a thermosetting resin having good bonding capability and high bonding reliability.

Figure 5C:
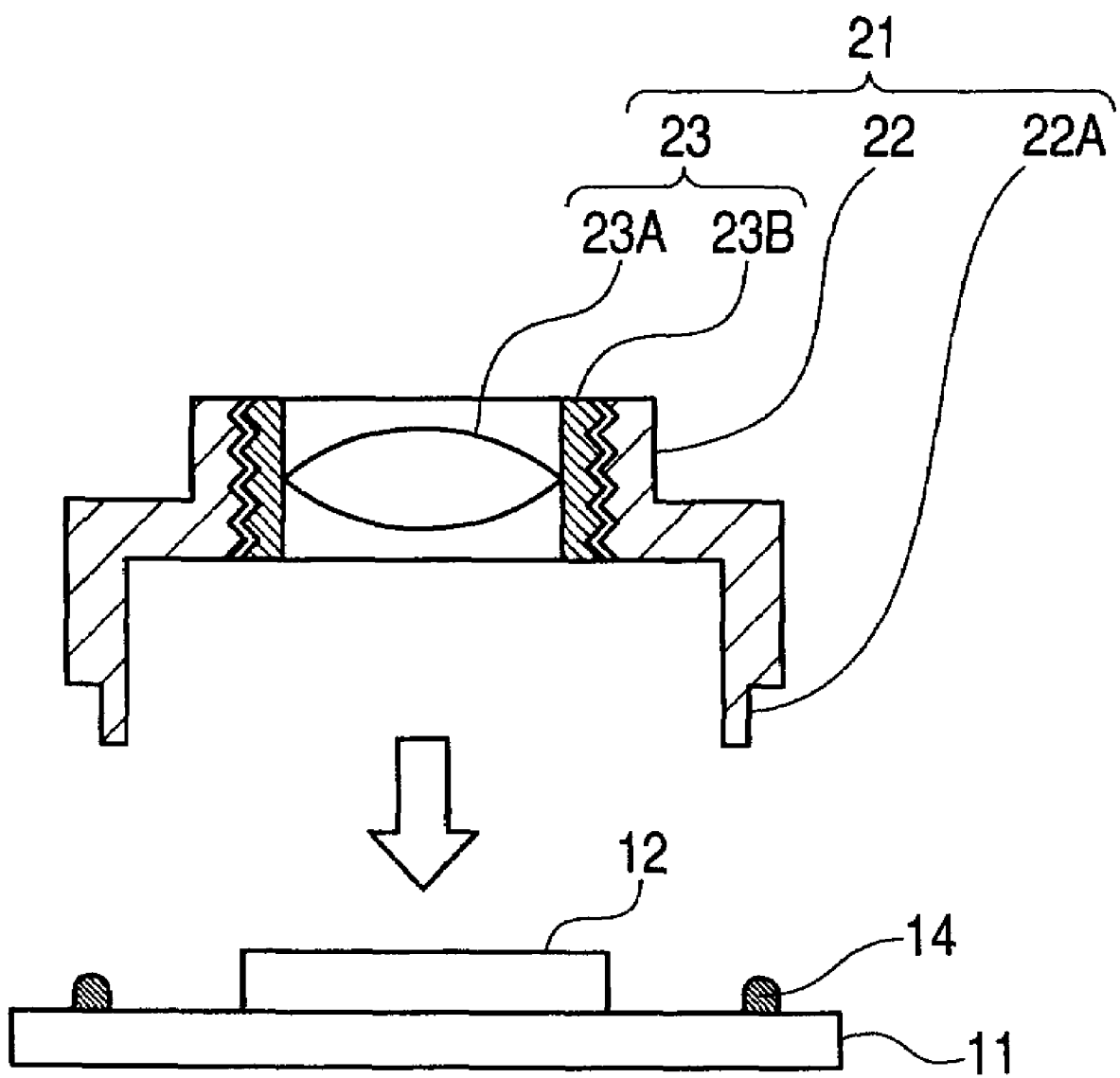
FIG. 5C is a view (third step) showing the method for manufacturing the semiconductor device shown in FIG. 2.

Next, in a step shown in FIG. 5C, the lower end of the structure main body 22 is depressed on the locating position of the adhesive 14 so that the structure main body 22 is bonded to the substrate 11. Further, the substrate 11 with the structure main body 22 bonded thereto is placed within a curing apparatus and subjected to curing treatment (heating treatment). Thus, the adhesive 14 is hardened so as to improve the bonding force.

In this way, the semiconductor device 10 as shown in FIG. 2 can be completed.

Additionally, the structure of the semiconductor device and its manufacturing method described above are examples of this invention and can be changed and modified in various manners. For example, the resin material of the structure main body 22 should not be limited to polycarbonate resin, but may be other resin materials. Likewise, the conductive material added to the resin material or the metallic coating formed on the surface should not be limited to the material described in the above embodiment, but may be various materials.

In accordance with this invention, there is provided a semiconductor device having a structure in which a semiconductor element is sealed on a substrate, capable of providing good reliability of the structure for sealing the semiconductor element and high reliability of electric connection.

It will be apparent to those skilled in the art that various modifications and variations can be made to the described preferred embodiments of the present invention without departing from the spirit or scope of the invention. Thus, it is intended that the present invention cover all modifications and variations of this invention consistent with the scope of the appended claims and their equivalents.

What is claimed is:

1. A semiconductor device comprising:
   a substrate;
   a semiconductor element mounted on a first side of the substrate;
   a sealing structure sealing the semiconductor element, the sealing structure being mounted on the substrate with a side of the sealing structure abutting the first side of the substrate; and
   an adhesive bonding the sealing structure with the first side of the substrate, wherein the sealing structure has a groove for storing the adhesive, the groove being provided in an entire circumference of the sealing structure and on said side of the sealing structure abutting the substrate.

2. The semiconductor device according to claim 1, wherein the semiconductor element is a photoelectric conversion element.

3. The semiconductor dote according to claim 2, wherein the sealing structure includes:
   a main body on which the groove is formed; and
   a condensing section for condensing an incident light on the semiconductor element, the condensing section being ached to the main body.

4. The semiconductor device according to claim 3, further comprising:
an adjusting section for adjusting a distance between the condensing section and the semiconductor element.

5. The semiconductor device according to claim 4 wherein:
said condensing section is moveable relative to said main body for adjusting said distance between the condensing section and the semiconductor element.

6. The semiconductor device according to claim 5 wherein:
said condensing section includes a lens and an attachment portion; and,
said adjusting section includes a first screw on the attachment portion and a second screw on an inner wall of the main body for adjusting said distance between the condensing section and the semiconductor element by relative movement between the attachment portion and the main body.

7. The semiconductor device according to claim 3, wherein the main body includes a conductive material.

8. The semiconductor device according to claim 7, wherein the main body is made of a mixed material including a resin material and the conductive material.

9. The semiconductor device according to claim 7, wherein a conductive coating is formed on a surface of the main body.

10. A semiconductor device comprising:
a substrate;
a photoelectric conversion element mounted on the substrate;
a sealing structure for sealing the photoelectric conversion element, the sealing structure being mounted on the substrate and having a main body including a conductive material; and
an adhesive bonding the sealing structure with the substrate, the sealing structure having a groove storing the adhesive, wherein the groove is provided in an entire circumference of the sealing structure.

11. The semiconductor device according to claim 10, wherein the sealing structure includes:
a condensing section for condensing an incident light on the photoelectric conversion element, the condensing section being attached to the main body.

12. A semiconductor device comprising:
a substrate;
a photoelectric conversion element mounted on the substrate; a sealing structure for sealing the photoelectric conversion element, the sealing structure being mounted on the substrate and having a main body including a conductive material;
an adhesive bonding the sealing structure with the substrate, the sealing structure having a groove storing the adhesive;
a condensing section for condensing an incident light on the photoelectric conversion element, the condensing section being attached to the main body: and.
an adjusting section for adjusting a distance between the condensing section and the photoelectric conversion element.

13. The semiconductor device according to claim 12 wherein:
said condensing section is moveable relative to said main body for adjusting said distance between the condensing section and the photoelectric conversion element.

14. The semiconductor device according to claim 13 wherein:
said condensing section includes a lens and an attachment portion; and,
said adjusting section includes a first screw on the attachment portion and a second screw on an inner wall of the main body for adjusting said distance between the condensing section and the photoelectric conversion element by relative movement between the attachment portion and the main body.

15. A semiconductor device comprising:
a substrate;
a photoelectric conversion element mounted on the substrate;
a sealing structure for sealing the photoelectric conversion element, the sealing structure being mounted on the substrate and having a main body including a conductive material: and
an adhesive bonding the sealing structure with the substrate, the sealing structure having a groove storing the adhesive, wherein the main body is made of a mixed material including a resin material and the conductive material.

16. A semiconductor device comprising:
a substrate;
a photoelectric conversion element mounted on the substrate:
a sealing structure for sealing the photoelectric conversion element, the sealing structure being mounted on the substrate and having a main body including a conductive material; and
an adhesive bonding the sealing structure with the substrate, the sealing structure having a groove storing the adhesive, wherein a conductive coating is formed on a surface of the main body.

* * * * *

UNITED STATES PATENT AND TRADEMARK OFFICE
CERTIFICATE OF CORRECTION

PATENT NO. : 7,504,670 B2  Page 1 of 1
APPLICATION NO. : 11/422777
DATED : March 17, 2009
INVENTOR(S) : Shiraishi et al.

It is certified that error appears in the above-identified patent and that said Letters Patent is hereby corrected as shown below:

Column 6, Line 67, (Claim 3, Line 6), delete "ached", insert --attached--.

Signed and Sealed this

Sixteenth Day of June, 2009

JOHN DOLL
*Acting Director of the United States Patent and Trademark Office*